United States Patent [19]
Mori

[11] Patent Number: 5,642,432
[45] Date of Patent: Jun. 24, 1997

[54] PROBE DEVICE

[75] Inventor: Shigeoki Mori, Ayase, Japan

[73] Assignee: Tokyo Electron Limited, Tokyo, Japan

[21] Appl. No.: 672,240

[22] Filed: Jun. 28, 1996

Related U.S. Application Data

[63] Continuation of Ser. No. 255,903, Jun. 7, 1994, abandoned, which is a continuation of Ser. No. 813,696, Dec. 27, 1991, abandoned.

[30] Foreign Application Priority Data

Dec. 28, 1990 [JP] Japan .................................. 2-408871

[51] Int. Cl.$^6$ ...................................................... G06K 9/00
[52] U.S. Cl. ............................ 382/145; 382/151; 382/286
[58] Field of Search ............................... 382/145, 146, 382/151, 204, 206, 209, 286, 287, 288, 289, 291, 294, 296; 348/94, 95, 190; 364/474.34, 474.37; 356/400, 401

[56] References Cited

U.S. PATENT DOCUMENTS 4,786,867 11/1988 Yamatsu ........................... 324/158 F
4,929,893 5/1990 Sato et al. ................................ 382/8

Primary Examiner—Leo Boudreau
Assistant Examiner—Phuoc Tran
Attorney, Agent, or Firm—Oblon, Spivak, McClelland, Maier & Neustadt, P.C.

[57] ABSTRACT

A device for examining the electrode pads of a semiconductor chip comprises a table for supporting a semiconductor wafer including chips each having two lines being substantially straight and consisting of a plurality of electrode pads, a probe card having two lines corresponding to the lines of the electrode pads, and consisting of a plurality of probes, first and second TV cameras for photographing the lines of the electrode pads and probes, and a control unit responsive to signals supplied from the cameras, for calculating first imaginary lines corresponding to the lines of the electrode pads and second imaginary lines corresponding to the lines of the probes, and for recognizing deviation between the first and second imaginary lines. The table is moved by the deviation so as to align the lines of the pads with those of the probes.

7 Claims, 5 Drawing Sheets

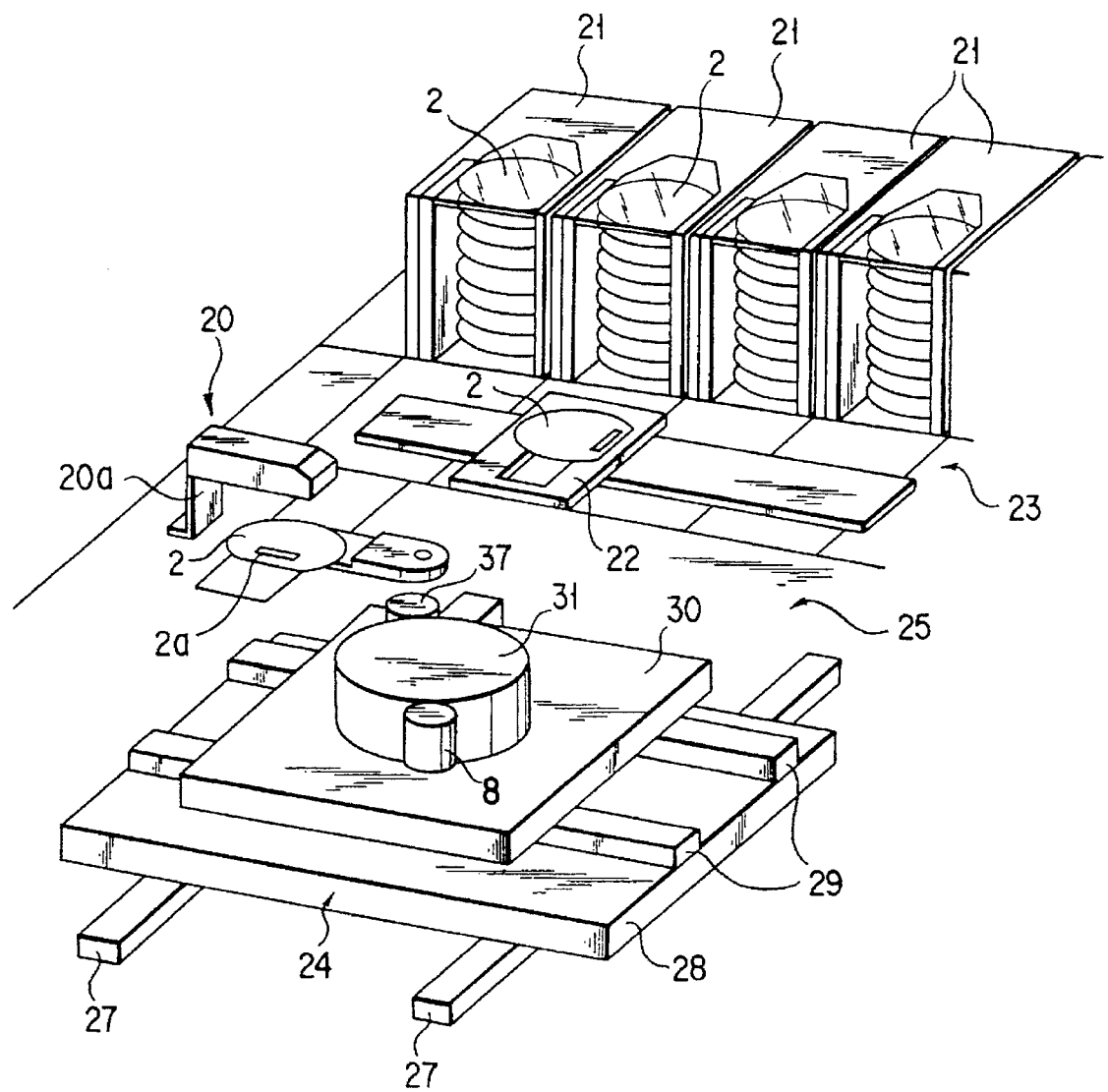
F I G. 2

5,642,432

PROBE DEVICE

This application is a Continuation of application Ser. No. 08/255,903, filed on Jun. 7, 1994, which is a Continuation of 07/813,696, filed on Dec. 27, 1991, both now abandoned.

BACKGROUND OF THE INVENTION

1. Field of the Invention

This invention relates to a probe device using a probe card.

2. Description of the Related Art

In a conventional semiconductor device manufacturing process, the electrical characteristics of a plurality of semiconductor chips as semi-finished products formed on a wafer are examined, thereby sorting them into good and bad ones, and hence enhancing the productivity. Probe devices have been used to examine the electrical characteristics of semiconductor chips formed on a wafer. The probe device has a wafer-holding table movable in X, Y, and Z directions and adapted to hold a semiconductor wafer with the use of a vacuum chuck or the like. A probe card incorporated in the probe device having a probe corresponding to each electrode pad of the chip is arranged above the wafer-holding table, and the table is moved in the Z direction, thereby contacting the probe with the electrode pad, and performing characteristic examination by a tester or the like on the basis of signals supplied through the probe.

In recent years, to perform the process of manufacturing semiconductor devices in a more clean atmosphere, each step of the process has been automated in an unmanned system. Accordingly, the probe device has also been automated by employing e.g. an automatic loader which can automatically load a wafer from a wafer carrier onto a wafer-holding table, and unload the wafer from the table.

However, in the above probe device, each electrode pad must be aligned with a corresponding one of the probes of a probe card, with high accuracy to a degree of several microns—several tens of microns. Further, to contact the probe with the electrode pad, the tip of the probe is adapted to slide on the surface of the electrode pad by so-called over driving (during sliding, the probe cuts the oxide film formed on the surface, thereby obtaining a reliable electrical contact). Thus, it is difficult in the conventional device to automatically perform the alignment. This being so, for example, at least at the time of exchange of probe cards, the track of the probes of a new probe card must be marked on a dummy wafer, and then the new probe card adjusted manually with reference to the track so as to align its probes with the electrode pads of the dummy wafer. Manual alignment, however, cannot be performed with high efficiency or with high accuracy.

SUMMARY OF THE INVENTION

It is the object of the invention to provide a probe device which can automatically perform alignment of each electrode pad formed on a semiconductor chip, with a corresponding one of the probes of a probe card with high accuracy.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 2 is a perspective view, showing part of a wafer transfer device coupled with the probe device;

DETAILED DESCRIPTION OF THE PREFERRED EMBODIMENTS

This invention will be explained with reference to the accompanying drawings showing embodiments thereof.

Figure 1:
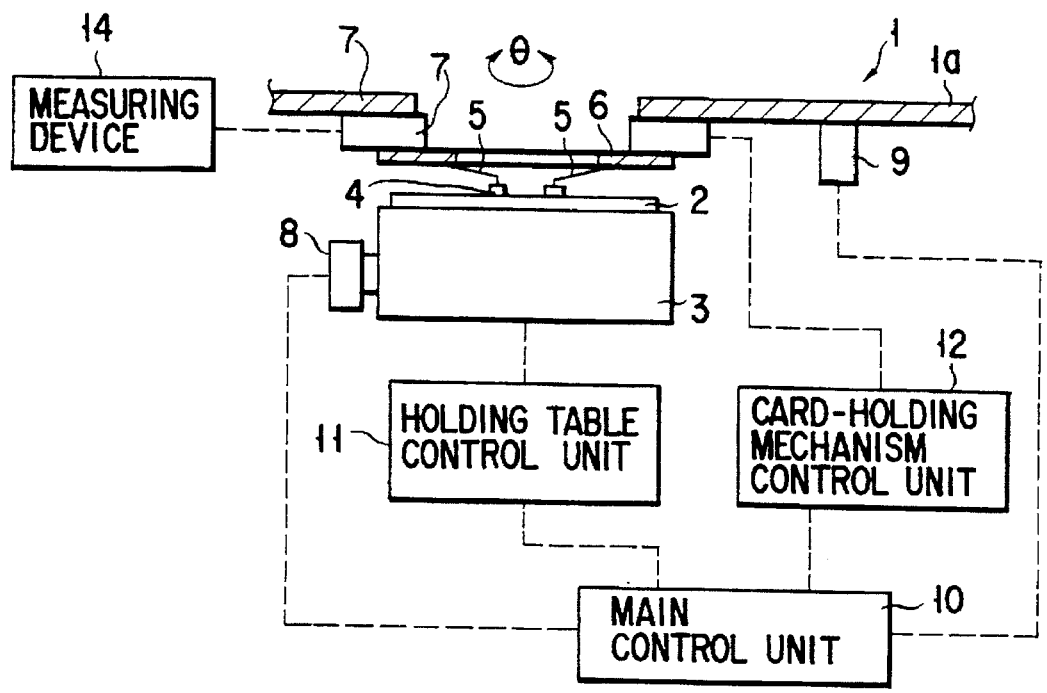
FIG. 1 is a view, schematically showing a probe device according to an embodiment of the invention.

As is shown in FIG. 1, a probe device 1 is equipped with a wafer-holding table 3 which can move in X, Y, and Z directions, and can suck and hold a semiconductor wafer 2 thereon by a vacuum chuck. The wafer is held on the table after it is roughly aligned by means of a known alignment mechanism (not shown). A plurality of rectangular chips each having an electrical circuit pattern are beforehand formed on each wafer. A plurality of electrode pads 4 serving as terminals of the electrical circuit pattern are provided around each chip at regular intervals. A card-holding mechanism 7 for holding a probe card 6 having a plurality of conductive probes 5 corresponding to the electrode pads 4 is provided above the wafer-holding table 3. The mechanism 7 has a support base plate 1a for supporting the probe card 6 such that the card 6 can rotate through θ degrees about its center, as is indicated by the arrow means for supporting the probe card 6 such that the probe card 6 rotates about its center, e.g., a pulse motor, are well known in the art, as disclosed in U.S. Pat. No. 4,677,474 at column 5, lines 24-28, and U.S. Pat. No. 4,864,227 at column 5, lines 55-57.

The wafer-holding table 3 has a side provided with a first television camera 8 which has a photographing surface directed upward and serves to photograph the probes 5 of the probe card 6. The support base plate 1a is provided with a second television camera 9 which has a photographing surface directed downward and serves as means for photographing the electrode pads 4 of each chip formed on the wafer 2. Signals output from the cameras 8 and 9 are input to a main control unit 10, which in turn determines the positions of the electrodes and probes from the signals, and supplies control signals to a holding table control unit 11 for controlling the movement of the table 3 in the X, Y, and Z directions, and to a card-holding mechanism control unit 12 for controlling the movement of the card-holding mechanism 7 in the θ direction, thereby performing the alignment.

Reference numeral 14 denotes a known measuring device such as a tester, electrically connected to the probes, for examining the electrical state of the electrode pads when the probes are brought into contact with the pads.

The wafer-holding table 3 is coupled with a wafer transfer device, as is shown in FIG. 2. The transfer device comprises a loader 23 having a wafer transfer mechanism 22 for holding and transferring those wafers 2 one by one which are contained in a wafer cassette 21, and a wafer transfer unit, movable in the horizontal and vertical directions, for holding each wafer 2 and transferring it to an examination unit 25 provided with wafer-holding means 24.

The wafer-holding means 24 comprises a Y-stage 28 slidable on rails 27 for guiding the stage in the Y direction, an X-stage 30 slidable on rails 29 for guiding the stage in the X direction, and a chuck 31 mounted on the X-stage 30 such that it can rise and fall (and can rotate through θ degrees in the horizontal direction). The chuck 31 has a peripheral thereof provided thereon with a probe-polishing device 37 for removing fine dust (e.g. shavings of an aluminum oxide film formed on an electrode pad) attached to the probe at the time of examination, and the first television camera 8. The operation and construction of probe polishing devices are well known in the art. For example, the probe tips may be polished using a truncated conical member, as disclosed in Japanese Patent Application Kokai, Publication, No. 64/55835.

In FIG. 2, reference numeral 20 denotes that discrimination device for discriminating, before and after the examination process of the wafer 2, a signal and a character put in a discrimination region 2a of the wafer 2 which is to be moved by a bracket 20a in the X, Y, and Z directions. The discrimination device 20 may be used to discriminate between semiconductor wafers and is not essential to the operation of the invention.

Figure 3:
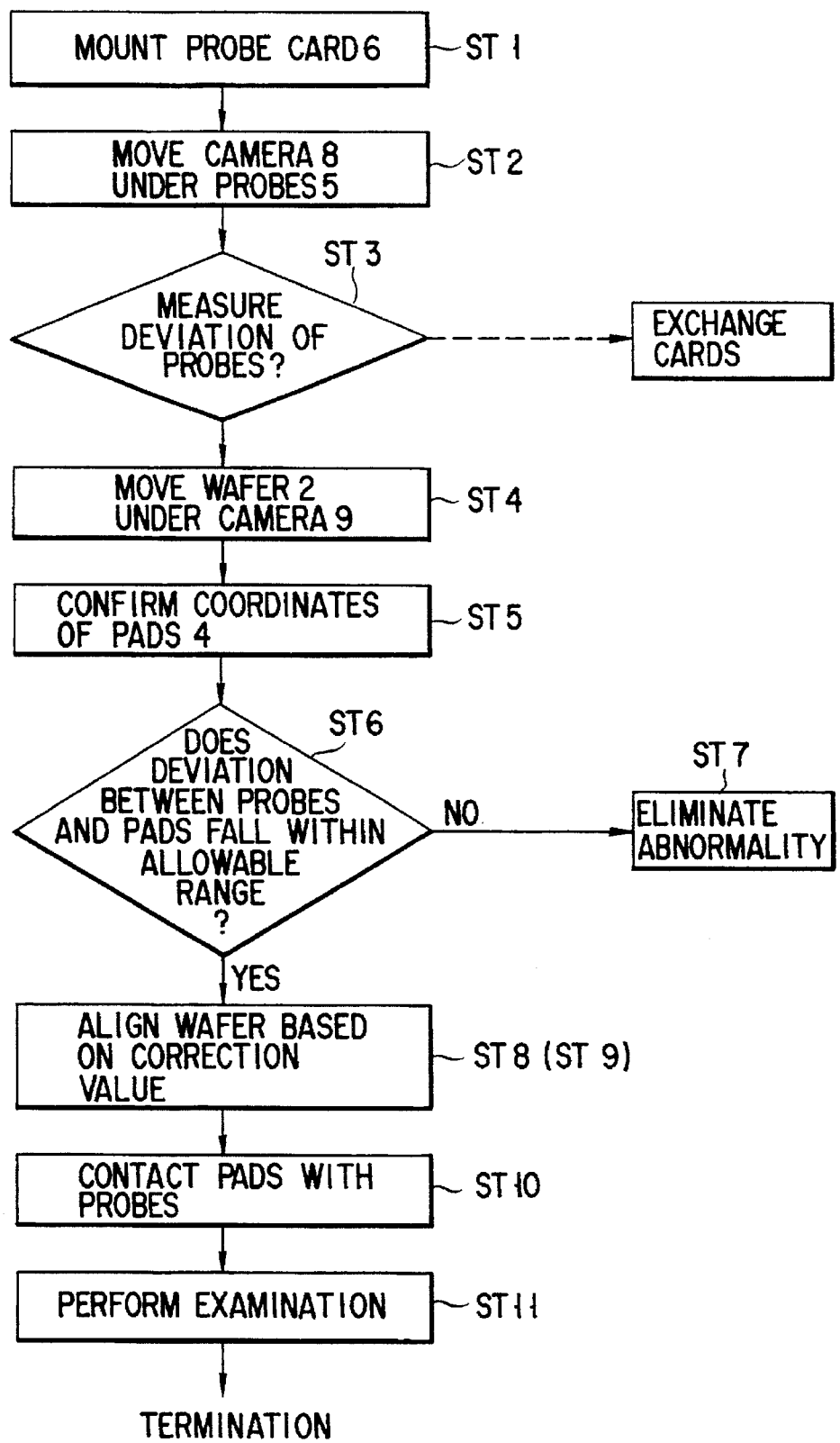
FIG. 3 is a flowchart, useful in explaining the operation of the device of FIG. 1.

The operation of the above-described device will be explained with reference to the flowchart of FIG. 3.

The probe card 6 is transferred by an automatic transfer mechanism (not shown), and is secured to the card-holding mechanism 7 (ST1). Subsequently, the semiconductor wafer 2 is subjected to rough alignment (pre-alignment) by using an auto-loader (not shown) such as an orientation flat, and is then sucked and held on the wafer-holding table 3 by e.g. a vacuum chuck. The first television camera 8 is moved under the center of the probe card 6 by moving the table 3 in the X direction (to the right in FIG. 1), thereby photographing the tips of the probes 5 from under (ST2). At this time, all the probes 5 may be simultaneously photographed. Alternatively, the probes may be sorted into groups, and the groups sequentially magnified and photographed. Alternatively, the entire probes may be photographed, and then some of them magnified and photographed by varying the focal point of the camera. To magnify and photograph probes, the camera 8 must be mounted, with fine movement means interposed so that the camera could slightly move in the X-Y direction with respect to the chuck 31. By virtue of the magnified photographing, the probes 5 of the probe card 6 can be screened, and if any defective probe is detected, the probe card 6 will be exchanged.

The electrode pads 4 are arranged in lines along all the sides of each rectangular semiconductor chip of the wafer 2. Thus, the tips of the probes 5 of the probe card 6 are arranged on the imaginary lines a, b, c, and d shown in FIG. 4 as solid lines. The camera 8 performs photographing while deriving the above four lines. Signals obtained as a result of the photographing are input to and stored in the main control unit 10.

Figure 5:
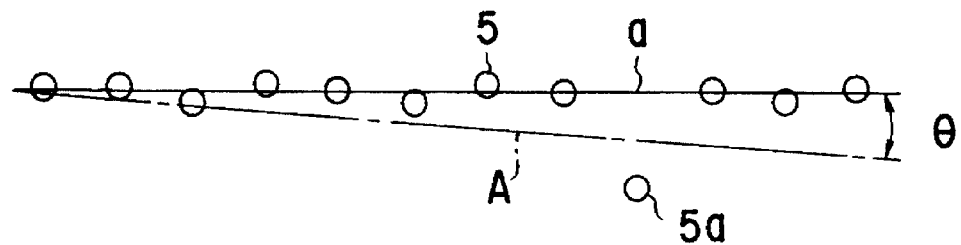
FIG. 5 is a view, showing the arrangement of probes, explaining the alignment method.

When the camera photographs the probes 5 while deriving the lines, those circular images of the tips of the probes which are substantially aligned with one another are obtained, as is shown in FIG. 5, since the tip surface of each probe is circular. In general, the position of a probe is deviated from the position of another by e.g. several microns—several tens of microns, so that the circular images are not accurately aligned with one another. The main control unit 10 determines an imaginary straight line (indicated by the solid line in FIG. 5) which is calculated to intersect as many circular images, or probe tips, as possible by means of the least square method (ST3). At this time, if, as shown in FIG. 5, a probe image 5a is detected to be greatly separated from the other images, the probe card 6 will be determined to be defective, and a signal requiring exchange of the card with a new one will be output. The determination is performed by, for example, comparing the number of the probes operated with that number of probes arranged in each line which is input beforehand in the main control unit 10.

Figure 4:
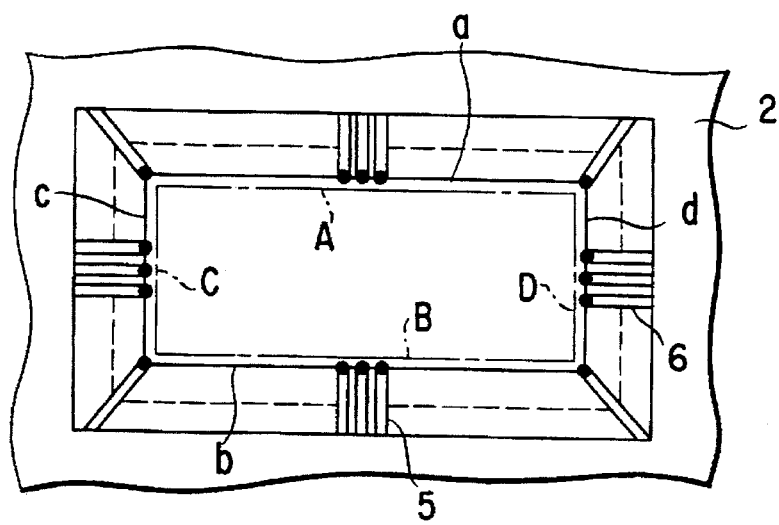
FIG. 4 is a view, showing the relationship between probes of a probe card and pads of a semiconductor chip, and useful in explaining an alignment method in the probe device.

The four imaginary straight lines a, b, c, and d of FIG. 4 are obtained by performing the above operation to two longitudinal lines of the probes and two transverse lines.

Thereafter, the wafer 2 is moved by the wafer-holding table 3 in the X direction, and its center is positioned under the second television camera 9 (ST4). The camera 9 photographs all the electrode pads 4 on the wafer 2, and supplies the main control unit 10 with signals indicative of results of the photographing, thereby obtaining imaginary straight lines (A, B, C, and D indicated by the one-dot-chain line in FIG. 4) corresponding to the four lines of the electrode pads 4, on the basis of the coordinate of the center of each electrode pad 4 (ST5), as in the case of the probe card 6. Therefore, imaginary lines A, B, C and D are obtained by calculating lines that intersect as many points as possible, which correspond to the electrode pads on the wafer 2, and in accordance with a least square method. At the time of examining the electrical characteristics, it is preferable to perform so-called overdrive in which the electrode pad 4 is brought into contact with the probe 5, and then is further urged against the same. The overdrive enables the probe 5 to slide on the electrode pad 4 in the longitudinal direction, thereby cutting an oxide film or insulating film formed on the metal pad 4, and obtaining reliable electrical conductivity. To this end, in a state where the probe and pad are not urged to each other, the rectangle defined by the pads 4, i.e., indicated by the one-dot-chain lines (A, B, C, and D), must be smaller than that defined by the probes 5, i.e., indicated by the solid lines (a, b, c, and d). The amount of the sliding is generally 5–15 μm and is determined by the angle and length of the probe 5, the amount of the overdrive, etc. Thus, the sliding amount is not constant. Further, since the tip of the probe 5 slides in the direction of its length, the sliding direction of a probe differs from that of another one in the same probe card 6.

The main control unit 10 compares an imaginary line defined by the probes, which is obtained by the first television camera 8, with that defined by the pads, which is obtained by the second television camera 9, and determines whether or not the amounts of deviation between the imaginary lines in the X and Y directions and the angle θ of inclination between the lines, i.e., the amounts of correction, fall within allowable ranges, respectively (ST6). The angle θ between the imaginary lines is determined by comparing corresponding pair of lines with each other (comparing e.g. A with a in FIG. 5).

To obtain the inclination angle θ, another pair of lines B and b may be compared with each other. Alternatively, the inclination angles θ of all the pairs may be determined, respectively, thereby obtaining the average value of them.

Further, correction amounts in the X and Y directions are calculated so as to correspond the coordinates of the mid point of each line (A, B, C, D) to those of the mid point of a line (a, b, c, d) arranged in parallel with the former.

If it is detected that the correction amount does not fall within an allowable range, the semiconductor wafer is determined to be defective with respect to the probe card, and hence is removed (ST7). If, on the other hand, it is detected that the correction amount falls within the allowable range, a signal is supplied to the holding table control unit 11 and card-holding mechanism control unit 12 to cause them to correct the deviation. Specifically, a correction signal for correcting the inclination angle θ calculated in the main control unit 10 is supplied to the card-holding mechanism control unit 12, thereby causing the card-holding mechanism 7 to rotate the probe card 6 and correct the inclination angle θ (ST8). Alternatively, the probe card 6 may be fixed, and the wafer-holding table 3 rotated. Signals indicative of the amounts of correction in the X and Y directions are supplied to the holding table control unit 11 to increase or decrease, by the correction amounts, the predetermined driving amounts of the holding table 3 in the X and Y directions, thereby correcting the deviation in the X and Y directions and aligning the wafer with the probes (ST9).

After the above-described alignment, the holding table 3 is raised (in the Z direction), thereby urging the probes 5 of the probe card 6 against the electrode pads 4 formed on each chip of the wafer 2 by the overdrive method (ST10). Subsequently, a measuring circuit such as a tester circuit 14 is driven to examine the electrical characteristics of the chips on the basis of electrical signals supplied via the probes 5 (ST11).

After the examination of one chip has been completed, the next one is examined in the same manner. Thus, all the chips are sequentially examined.

As described above, in the above embodiment, the pads 4 and probes 5 are recognized as imaginary straight lines, respectively, and correction is performed on the basis of the angle θ between the imaginary lines, and on the basis of the deviation in the X and Y directions between the lines. Thus, accurate alignment can be performed even when various probe cards are used whose probes have different sliding amounts while being overdriven. Accordingly, the electrode pads 4 can be aligned with the probes 5 completely automatically.

Figure 6:
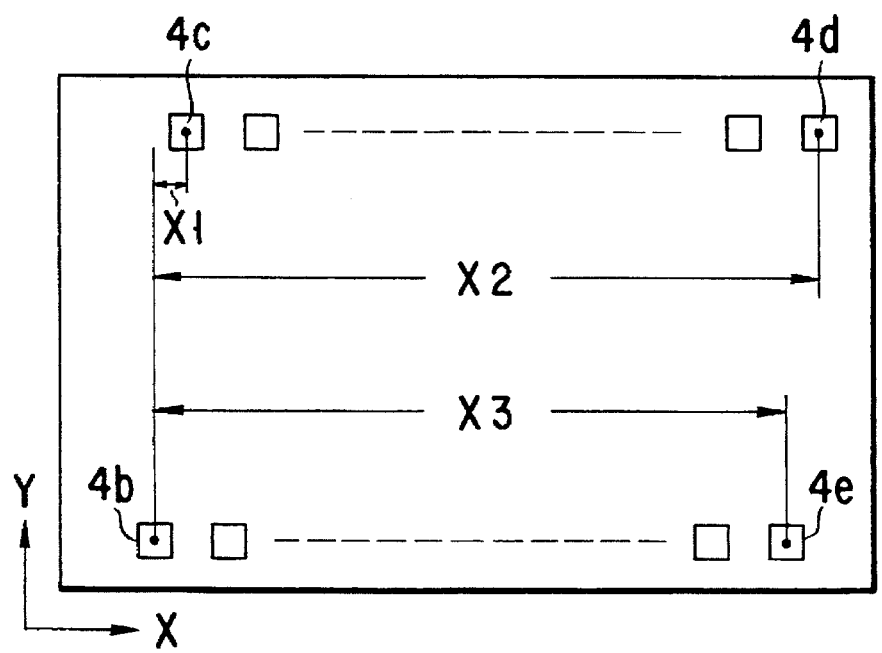
FIG. 6 is a view, explaining an alignment method in another embodiment of the invention.

In the above embodiment, the electrode pads 4 (or the probes 5) are arranged in four lines forming a rectangle. On the other hand, in a case, as shown in FIG. 6, where the electrode pads 4 (or probes 5) are arranged in two lines parallel with each other, alignment can be performed easily in a line perpendicular to the line in which they are arranged, i.e. in the Y direction, whereas alignment cannot be performed easily in the line in which they are arranged, i.e., in the X direction. In this case, alignment in the X direction may be performed as follows:

One (e.g. 4b in FIG. 6) of four pads 4 (or four probes 5) arranged at the four corners of each chip is selected as reference pad (or probe). Then, a distance X1 between the mid point of the reference pad 4b and that of a pad 4c, a distance X2 between that of the pad 4b and that of a pad 4d, a distance X3 between that of the pad 4b and that of a pad 4e are obtained. Similarly, as regards the probes 5, distances x1–x3 corresponding to the distances X1–X3 are obtained. Then, a minimum value of a which satisfies the equation $(X1-x1)+(X2-x2)+(X3-x3)=a$ is obtained, thereby performing alignment in the X direction. This method is not limited to the pads 4 (or probes 5) arranged at the four corners of each chip, but may be applied to more pads (or probes).

In regard to the equation $(X1-x1)+(X2-x2)+(X3-3)=a$, lines (c, C, d, D) cannot be obtained because no probes or electrode pads exist along these lines, as shown in FIG. 6. Alignment in the Y direction is easily accomplished, whereas alignment in the X direction is more difficult. The above equation provides a scheme for aligning the probes and electrode pads in the X direction. As in the first embodiment, the alignment of probes and electrode pads in the second embodiment of FIG. 6 first compares the differences between parallel lines, which correspond to the probes and electrode pads. Specifically, FIG. 6 shows distances X1, X2 and X3. These distances may be thought of as points along the X-axis where parallel lines are positioned, these lines extend in the Y direction. These lines represent rough estimates where lines C and D are, as in FIG. 4. Similarly, distances x1, x2 and x3 are derived, representing lines extending in the Y direction at different points along an x-axis. The difference between the lines (X1, x1) represents the distance the probes and electrode pads must be shifted to achieve alignment. Similarly, the distances between lines (X2, x2) and (X3, x3) yield alignment distances also. Adding these alignment distances together would produce an average distance that all of the probe card needs to be shifted relative to the wafer.

Though the invention is applied to the pads of a semiconductor chip in a wafer stage in the embodiment, it is a matter of course that it may be also applied to those of a packaged chip.

Further, the pads arranged in a line do not necessarily have the same size. If pads of different sizes are included in the pads arranged in a line, it is preferable to determine the imaginary line on the basis of smaller pads.

Figure 7A:
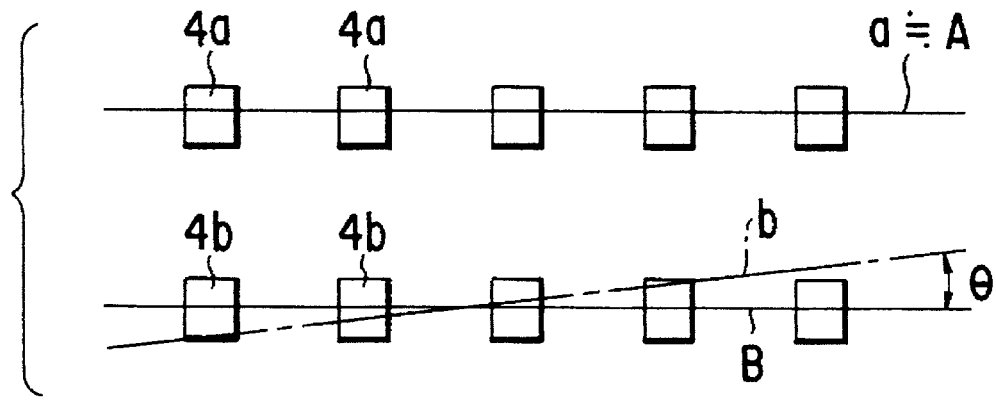
FIGS. 7A and 7B are views, explaining alignment using an average value.
Figure 7B:
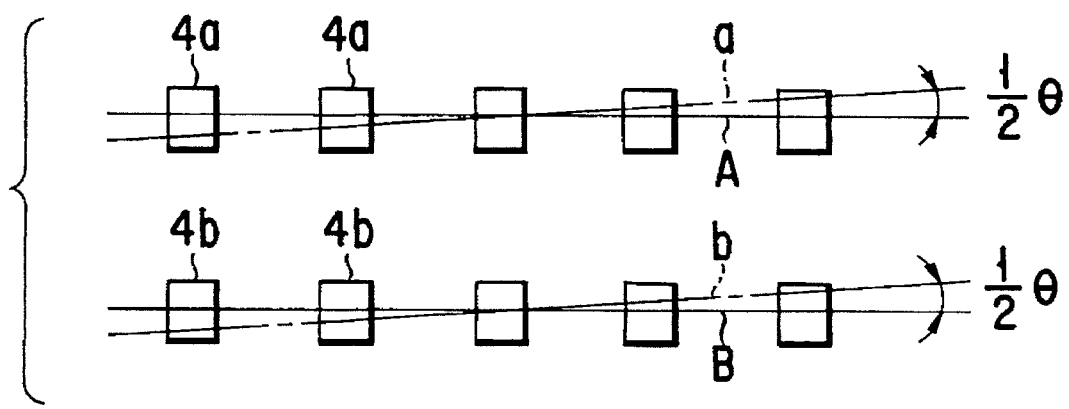

Then, alignment using an average value will be explained with reference to FIGS. 7A and 7B. See the case shown in FIG. 7A, in which the angle θ between an imaginary line a of probes arranged in e.g. the upper line in the probe card and a corresponding imaginary line A of pads 4a falls within an allowable range (in this case, θ=0), while the angle θ between an imaginary line b of probes arranged in the other or lower line in the probe card and a corresponding imaginary line B of pads 4b falls outside the allowable range. In this case, if screening is performed on the basis of the imaginary lines b and B only, this chip is determined to be defective. To avoid this, the average value (½×θ) of the angle (0) between the imaginary lines a and A and that (θ) between the other imaginary lines b and B is calculated. If the average value falls within the allowable range, the main control unit 10 controls to rotate the probe card by the angle (½×θ), as is shown in FIG. 7B.

As is described above, the probe device of the invention can perform an accurate alignment of probes thereof with electrode pads of each semiconductor chip on a wafer, thereby facilitating automation thereof.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A probe device comprising:

first supporting means for supporting a semiconductor chip having a plurality of electrode pads arranged on at least one pair of lines substantially straight and parallel with each other;

a probe card having a plurality of probes with tips, arranged on at least one pair of lines parallel with each other and corresponding to the lines of the electrode pads;

second supporting means for supporting the probe card;

a first camera for photographing the lines of the probe tips;

a second camera for photographing the lines of the electrode pads;

recognizing means responsive to signals output by the first and second photographing cameras, for recognizing the lines of the electrode pads and the lines of the tips of the probes as first imaginary straight lines and second imaginary straight lines, and mid-points of one of the first imaginary straight lines and one of the second imaginary straight lines, respectively;

means for rotating the first and second supporting means relative to each other to equalize the inclination of the first lines corresponding to the lines of the electrode pads, with that of the second lines corresponding to the lines of the tips of the probes, and also for moving the first and second supporting means relative to each other to make the mid point of one of the first lines agree with that of one of the second lines; and means for causing each electrode pad to contact a corresponding probe;

wherein said means for rotating further comprises means for rotating said first and second supporting means relative to each other by an angle equal to an average of angles between adjacent first lines and second lines, said angles measured when the mid point of one of said first lines is aligned with the mid point of one of said second lines.

2. The probe device according to claim 1, wherein said recognizing means recognizes the first line and the corresponding second line which are shifted parallel to each other at a predetermined interval.

3. The probe device according to claim 2, wherein said interval is set to 5–15 μm.

4. The probe device according to claim 1, wherein the first supporting means has a supporting table supporting the first camera, which is movable between a first position in which the first camera faces the probe card to photograph the lines of the probes, a second position in which the second camera faces the semiconductor chip to photograph the lines of the electrode pads, a third position in which the semiconductor chip faces the probe card with a space interposed therebetween, and a fourth position in which the semiconductor chip is in the vicinity of the probe card so that each of the electrode pads contacts a corresponding one of the probes.

5. The probe device according to claim 1, further comprising means electrically connected to the probes, for examining the electrical states of the electrode pads when the pads are brought into contact with the probes.

6. A probe device according to claim 1 wherein the rotating means rotates the first and second supporting means relative to each other, and wherein the contacting means does not contact the electrode pads with the probes until the rotating means has centered the first and second lines.

7. A probe device comprising:

means, movable in X, Y and Z directions, for supporting a semiconductor chip having two pairs of lines being substantially straight and each consisting of a plurality of electrode pads, the lines of each pair being parallel with each other, one of the pairs being perpendicular to the other of the pairs;

a probe card having two pairs of lines each consisting of probes corresponding to the electrode pads;

means for rotatably supporting the probe card;

first photographing means mounted on the chip supporting means and movable together therewith, so as to photograph the lines of the probes;

second photographing means mounted on the probe card supporting means, so as to photograph the lines of the electrode pads;

means responsive to signals supplied from the first and second photographing means, for recognizing the lines of the electrode pads and the lines of the probes as first lines and second lines and mid points of one of the first lines and one of the second lines, respectively, and for outputting a first signal indicative of the second lines and a second signal indicative of the first lines;

means responsive to the second signal for moving the chip supporting means relative to the probe card supporting means in X and Y directions, to make the mid point of one of the first lines agree with that of one of the second lines, so as to make each of the electrode pads contact a corresponding one of the probes; and means, electrically connected to the probes, for examining the electrical states of the electrode pads when the electrode pads are brought into contact with the probes;

wherein said means responsive to the second signal further comprises means for rotating said first and second lines relative to each other by an angle equal to an average of angles between adjacent first lines and second lines, said angles measured when the mid point of one of said first lines is aligned with the mid point of one of said second lines.

* * * * *